United States Patent
Konagaya

(10) Patent No.: US 6,474,836 B1
(45) Date of Patent: Nov. 5, 2002

(54) LIGHT SOURCE AND ORIGINAL READING DEVICE

(75) Inventor: Tatsuya Konagaya, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 176 days.

(21) Appl. No.: 09/610,442

(22) Filed: Jul. 3, 2000

(30) Foreign Application Priority Data

Jul. 2, 1999 (JP) .......................................... 11-188625

(51) Int. Cl.$^7$ ................................................ F21V 9/00
(52) U.S. Cl. ........................ 362/231; 362/235; 362/240; 362/241; 257/98; 174/250
(58) Field of Search ................................ 362/231, 235, 362/240, 241, 249; 174/250–265; 313/500; 257/98

(56) References Cited

U.S. PATENT DOCUMENTS 5,278,432 A * 1/1994 Ignatius et al. ............. 257/235
5,607,227 A * 3/1997 Yasumoto et al. .......... 362/249
6,036,328 A * 3/2000 Ohtsuki et al. .............. 362/31

* cited by examiner

Primary Examiner—Sandra O'Shea
Assistant Examiner—Ali Alavi
(74) Attorney, Agent, or Firm—Sughrue Mion, PLLC

(57) ABSTRACT

A light source and an original reading device are provided in which light can be emitted uniformly and with a low loss of light amount, by a minimum required number of light emitting elements. A surface of a substrate, at which surface LED elements are disposed, is covered with a resist film having high reflectance, such as a white resist film. Light emitted toward the substrate from the LED elements is reflected toward a photographic film (toward a side of the LED elements opposite a substrate side of the LED elements). In this way, at an LED light source, almost all of light emitted from the LED elements can be emitted toward the photographic film. A diffusion box is disposed so as to surround a periphery of the LED light source. Due to a light reflection diffusion plate of the diffusion box, light, which is emitted from the LED light source and enters into the diffusion box, is guided toward the photographic film while being diffused and reflected. In this way, the light is guided while being collected, without a loss in an amount of light incident from the LED light source. Non-uniformity of a light amount distribution can be corrected even more (non-uniformity of a light amount can be reduced).

16 Claims, 14 Drawing Sheets

F I G. 4
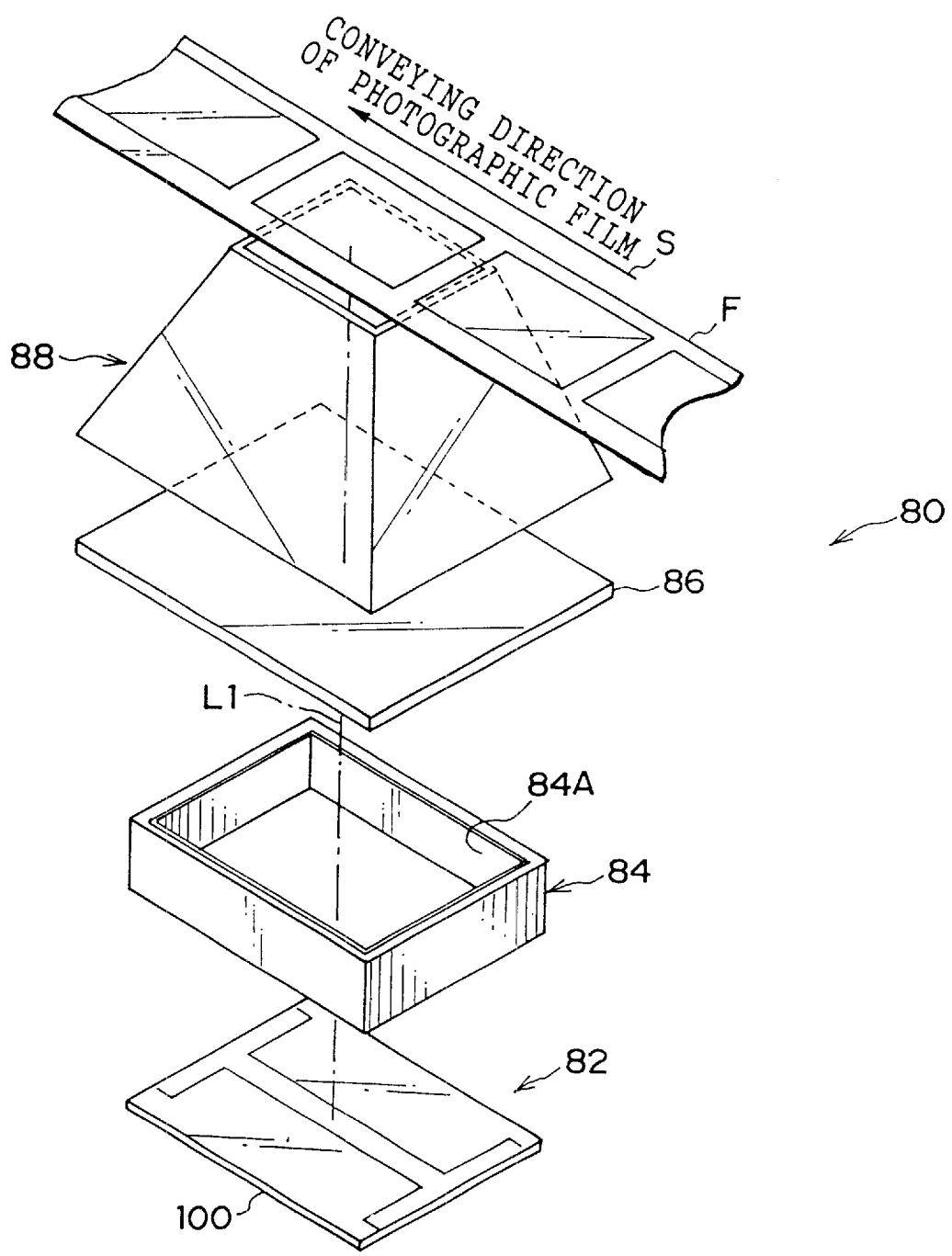

F I G. 9
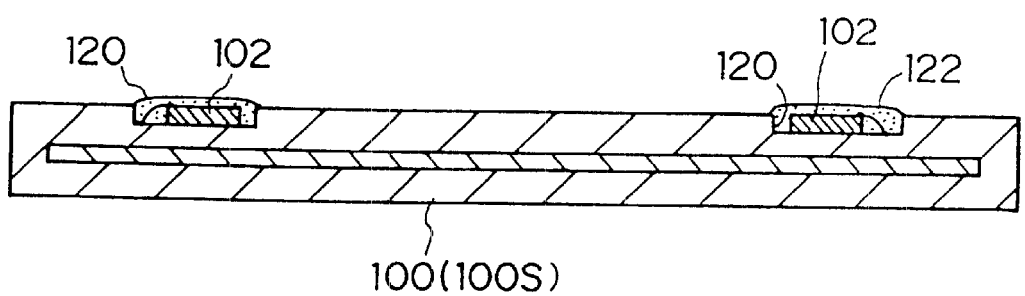

F I G. 1 3
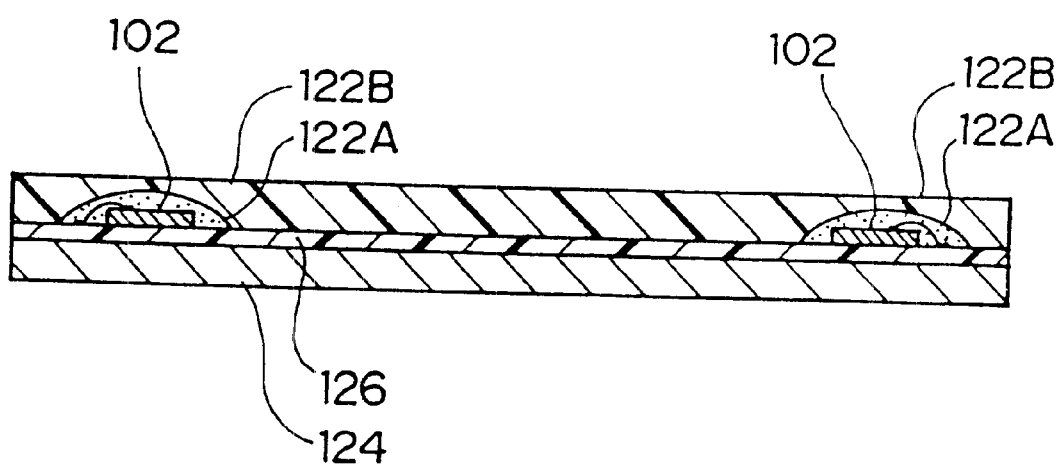

LIGHT SOURCE AND ORIGINAL READING DEVICE

BACKGROUND OF THE INVENTION

1. Field of the Invention

The present invention relates to a light source and an original reading device, and in particular, to a light source which is formed by connecting terminals of a plurality of light emitting elements to predetermined positions of a wiring pattern formed in advance on a substrate, and to an original reading device which irradiates light onto an original and reads the transmitted image or the reflected image by light converting elements.

2. Description of the Related Art

In recent years, original reading devices have been realized in which illumination light is irradiated onto an original such as a photographic film, and the reflected or transmitted light, which includes image information of the image recorded on the original, from the original is received by a CCD (charge coupled device) such that the image recorded on the original is read. Processings such as various types of correction are carried out on the image data obtained by the reading. Thereafter, the image is recorded onto a recording material such as a photographic printing paper, or the image is displayed on a display. Such an original reading device is advantageous in that it is easy to make automatic the operations from the reading of an image recorded on an original to the recording of the image onto a recording material such as a photographic printing paper.

In the original reading device described above, conventionally, a white light source such as a halogen lamp or the like has been used as the light source for illuminating the original. However, in recent years, devices have been realized in which, instead of a white light source, an LED light source is used. The LED light source is structured by a plurality of LED elements, which emit colors of RGB (IR (infrared) light can also be emitted in order to detect positions of scratches), being arrayed on a substrate.

By using an LED light source, filters for color separation of the light emitted from the white light source can be eliminated, thus making the structure of the device more simple. Further, setting of the conditions, such as the respective color balances and the like, can be simplified.

Because the amount of output light of an LED light source is generally lower than that of a halogen lamp, the light must be used efficiently. However, light emitted from the respective LED elements of the LED light source is also emitted in directions other than toward the original (some of the light is not emitted toward the original). For example, because the surface of the substrate is generally a color having low reflectance (e.g., a dark green color), light emitted toward the surface of the substrate at which the LED elements are mounted cannot be used as light for illuminating the original, and the efficiency of utilizing the light is poor.

Further, the LED elements are arrayed on the substrate at predetermined pitches. Thus, as opposed to a light source having continuous light emitting points, the distribution of the amount of light illuminated toward the surface of the original is not uniform (known as non-uniformity of the light amount), and thus, a problem arises in that non-uniform density is exhibited in the read image.

Attempts have been made to eliminate this non-uniformity of the light amount by providing a diffusion plate on the optical path. However, the amount of light is reduced due to the diffusion plate, and even more LED elements must be provided in order to obtain the amount of light needed, which leads to an increase in the number of parts.

Further, the LED elements on the substrate of the LED light source break easily due to shocks or the like. Even if only one LED elements breaks, the entire LED light source must be replaced, which results in the problem of high operating costs.

SUMMARY OF THE INVENTION

The present invention was developed in order to overcome the above-described drawbacks, and an object of the present invention is to provide a light source and an original reading device which can emit light uniformly with a low loss of light and with the minimum number of light emitting elements necessary, and in which breaking of light emitting elements on a substrate can be prevented.

In order to achieve the above object, a first aspect of the present invention is a light source structured by a plurality of light-emitting elements being connected to predetermined positions of a wiring pattern formed in advance on a substrate, the light source comprising: a reflecting member provided at a position of the substrate other than positions at which the plurality of light-emitting elements are disposed on the substrate, the reflecting member having a reflectance which is higher than a reflectance of the substrate.

In accordance with the first aspect of the present invention, the reflecting member is provided on the substrate on which the light emitting elements (LEDs, ELs or the like) are disposed such that the reflecting member is not disposed at positions at which the light emitting elements are disposed. (Namely, the reflecting member is disposed at a predetermined position of the substrate, which is other than the positions at which the light emitting elements are disposed.) As a result, the light emitted from the light emitting elements backward (toward the substrate) is reflected forward by the reflecting member. The reflectance of the reflecting member is higher than the reflectance of the substrate. Thus, more light can be reflected forward as compared with a case in which no reflecting member is provided. Together with the direct light emitted directly forward from the light emitting elements, the large amount of reflected light which is reflected by the reflecting member can also be used as effective light source light. The efficiency of light use can thereby be improved.

In a second aspect of the present invention, in the first aspect, the reflecting member is a film which is of a substantially white color and which protects a surface of the substrate.

In a third aspect of the present invention, in the first aspect, the reflecting member is a reflective plate which is provided on the substrate.

The reflecting member may be, as in the second aspect, a substantially white (i.e., a color having a high reflectance) resist film for protecting the surface of the substrate (a corrosion-resistance protective film provided on the surface of the substrate for preventing the wiring on the substrate from being corroded due to oxidation or the like). Or, as in the third aspect, the reflecting member may be a reflecting plate (which is adhered onto the substrate).

A fourth aspect of the present invention is a light source structured by a plurality of light-emitting elements being connected to predetermined positions of a wiring pattern formed in advance on a substrate, wherein a surface of the substrate on which the light-emitting elements are disposed is substantially white.

In a fifth aspect of the present invention, in the fourth aspect, the substrate is a ceramic substrate.

In accordance with the fourth aspect, a substrate is used whose surface, on which light emitting elements (LEDs, ELs or the like) are disposed, is substantially white (i.e., a color having high reflectance). In this way, the light emitted backward (toward the substrate) from the light emitting elements is reflected forward. For example, as in the fifth aspect, a ceramic substrate may be used as the substrate on which the light emitting elements are provided.

In this way, in the same way as in the first aspect, together with the direct light emitted from the light emitting elements directly forward, the large amount of reflected light reflected by the substrate surface on which the light emitting elements are provided can be used as effective light source light. Thus, the efficiency of utilization of light can be improved.

In a sixth aspect of the present invention, the light source of any of the first through third aspects further comprises a tube-shaped light collecting member which is provided at a surface side of the substrate at which the light-emitting elements are disposed, and which encompasses the substrate, and whose inner peripheral surface is a reflection diffusion surface having a reflectance of substantially 100% and a diffuse reflectance of substantially 100%.

In accordance with the sixth aspect of the present invention, the tube-shaped light collecting member is provided at the surface side of the substrate on which the light emitting elements are provided. More specifically, the light collecting member stands upright at the periphery of the substrate so as to encompass the substrate. A reflecting diffusing surface is formed at the inner peripheral surface of the light collecting member. In this way, the light emitted from the light emitting elements (the light including the direct light and the reflected light) is diffused and reflected by the reflecting diffusing surface. Thus, light can be collected in a desired direction and the light amount distribution of the collected light can be made uniform (i.e., non-uniformity of the light amount can be suppressed) without a loss in the amount of light.

A seventh aspect of the present invention is a light source structured by a plurality of light-emitting elements being connected to predetermined positions of a wiring pattern formed in advance on a substrate, wherein the substrate has at least one recess portion which is formed to be deeper than a heightwise dimension of the light emitting element, and at least one light emitting element is disposed in the recess portion.

In an eighth aspect of the present invention, the light source of the seventh aspect further comprises a protective resin layer which is insulative and covers at least the light emitting element within the recess.

In accordance with the seventh aspect of the present invention, the light emitting element(s) is (are) disposed in the recess portion(s) which is (are) deeper than the heightwise dimension of the light emitting element(s). Thus, breaking of the light emitting elements can be prevented.

At this time, if a protective resin layer such as that of the eight aspect of the present invention is provided in the recess portion, the moisture-resistance of the light emitting elements and the wires can be improved, and corrosion of the light emitting elements and the wires and the like on the substrate can be prevented.

A ninth aspect of the present invention is a light source structured by a plurality of light-emitting elements being connected to predetermined positions of a wiring pattern formed in advance on a substrate, the light source comprising: a protective resin layer which is insulative and covers one of a portion of and all of a surface of the substrate so as to cover at least the light emitting elements.

In accordance with the ninth aspect of the present invention, a portion of or all of the substrate surface is covered by the protective resin layer such that at least the light emitting elements are covered. Thus, breakage of the light emitting elements can be prevented, and corrosion of the light emitting elements and the wires and the like can be prevented.

In a tenth aspect of the present invention, in the eighth aspect, the protective resin layer is a milky-white color.

As in the tenth aspect of the present invention, if the protective resin layer is a milky white color, non-uniformity of the light amount can be suppressed even more.

In an eleventh aspect of the present invention, in any of the first through tenth aspects, the substrate is divided into plural divisional regions, and on/off control of the light emitting elements disposed in the divisional regions can be carried out per divisional region.

In accordance with the eleventh aspect, the substrate is divided into a plurality of regions, and for each of the divisional regions, the light emitting elements disposed therein can be on/off controlled independently of the light emitting elements of the other divisional regions. Namely, it is possible to turn the light emitting elements of only desired divisional region(s) on and off (i.e., it is possible to make only the light emitting elements disposed in a desired divisional region(s) emit light/not emit light). In this way, for example, control can be carried out such that, in accordance with the amount of light needed as the light source, the number of divisional regions which are turned on is varied and light of an amount greater than that needed is not outputted. This results in energy conservation. Further, light can be outputted by switching the on/off states of the divisional regions per each short period of time (i.e., pulse lighting can be carried out), such that the life of the light source can be extended.

In a twelfth aspect of the present invention, in any of the first through tenth aspect of the present invention, the substrate is structured by combining a plurality of secondary substrates, and on/off control of the light emitting elements disposed on the secondary substrates can be carried out per secondary substrate.

In accordance with the twelfth aspect of the present invention, the substrate is structured by combining a plurality of secondary substrates. For each of the secondary substrates, the light emitting elements disposed thereon can be on/off controlled independently of the light emitting elements of the other secondary substrates. Thus, for example, a light source manufacturer can manufacture light sources in units of small secondary substrates, rather than in the conventional units of large substrates, leading to a lowering of the production cost of the light source. Further, if there are problems with some of the light emitting elements, such as elements have expired or have been broken, conventionally, there was the need to replace the entire large substrate. However, in accordance with the present invention, it suffices to replace only the small secondary substrate on which the problematic light emitting elements are disposed.

In a thirteenth aspect of the present invention, in any of the first through the twelfth aspects, the plurality of light-emitting elements are different types of light emitting elements which output lights of respectively different wavelength bands, and on/off control of the light emitting elements of the different types can be carried out per type.

In accordance with the thirteenth aspect of the present invention, light emitting elements of different types which emit light of different wavelength bands (such as R, G, and B) are on/off controlled per type. In this way, the outputting of light can be switched between R, G, and B lights. For example, it is possible to output only R light from the light source, or to output R, G and B lights simultaneously.

In a fourteenth aspect of the present invention, in any of the first through thirteenth aspects, the light emitting elements are formed from plural circuits which are each formed from plural light emitting elements connected in series, the plural circuits are disposed in parallel on the basis of a predetermined pattern, and (simultaneously) on/off control of the light emitting elements of the circuits can be carried out per circuit.

In accordance with the fourteenth aspect, a plurality of circuits, in each of which a plurality of light emitting elements are connected in series, are disposed parallel to one another (are parallel connected). On/off control can be carried out for each of the circuits. In this way, for example, if a problem arises in a light emitting element of any of the circuits, such as the light emitting element is no longer able to emit light, the effect of that problem is limited to that circuit. By controlling the other circuits, which are parallel connected, in consideration of the problematic circuit, the light source can function effectively by use of the light emitting elements of only these other circuits.

The number of light emitting elements which are turned on can be controlled in accordance with the number of circuits which are on. Thus, adjustment of the output light amount-can be carried out easily. Further, if the light emitting elements of the series connected circuit are the same type of light emitting elements, by carrying out on/off control on a circuit-by-circuit basis, on-off control can be carried out per type of light emitting element. Thus, the adjustment of the light amount balance (the color balance) can also be carried out easily.

The fifteenth aspect of the present invention is an original reading device comprising the light source of any of the first through fourteenth aspects, wherein light from the light source is illuminated onto an original, and one of a transmitted image and a reflected image is read by photoelectric converting elements.

In accordance with the fifteenth aspect, the invention of any of the first through fourteenth aspects is used as a light source for illuminating light onto an original.

For example, if the invention of any of the first through fifth aspects is used, due to the reflecting member or the substantially white substrate surface, a greater amount of light is reflected toward the original and light can be utilized more efficiently. Thus, the light amount needed for reading of an original can be obtained even if the number of light emitting elements it not increased, i.e., with a number of light emitting elements which is smaller than the number used conventionally.

If the invention of the sixth aspect is applied, the light emitted from the light emitting elements (the direct light and reflected light) is diffused and reflected by the inner peripheral surface of the light collecting member, such that the light amount distribution is made uniform. Accordingly, light can be illuminated uniformly onto the original, and highly precise (i.e., with little non-uniformity of density) reading of an original is possible.

Further, if the invention of any of the seventh through ninth aspects is applied, breakage of the light emitting elements and corrosion of the light emitting elements or the wires can be prevented. Thus, the light source can be changed less frequently, which leads to a reduction in operating costs. Moreover, if the invention of the tenth aspect is applied, the light amount distribution of the light (direct light and reflected light) illuminated onto the original is made uniform. Accordingly, light can be illuminated uniformly onto the original, and highly precise (i.e., with little non-uniformity of density) reading of an original is possible.

If the invention of the eleventh aspect is applied, on/off control of the light emitting elements is carried out per divisional region of the divided substrate. Thus, for example, the number of divisional regions which are turned on can be varied, in accordance with the type of the original or with the density of the recorded image, such that light is not outputted in an amount which is greater than needed. Thus, energy can be conserved. Further, for example, light can be outputted by switching the on/off state of the divisional regions per short period of time (i.e., pulse lighting can be carried out) such that the life of the light source can be extended. In this way, the light source can be changed less frequently, which results in a reduction in operating costs.

If the invention of the twelfth aspect is applied, the light emitting elements can be on/off controlled per secondary substrate forming the substrate. Because the light source is manufactured in units of secondary substrates (For example, the structures of the secondary substrates are the same.), the production cost can be reduced. Further, if there are problems with some of the light emitting elements, such as elements have expired or have been broken, conventionally, there was the need to replace the entire large substrate. However, in accordance with the present invention, it suffices to replace only the small secondary substrate on which the problematic light emitting elements are disposed. Thus, the operating costs can be reduced.

If the invention of the thirteenth aspect is applied, on/off control of the light emitting elements is carried out per type of the light emitting elements which emit light of different wavelength bands such as R, G, and B. Thus, light can be illuminated by switching between R, G and B lights, or only R light can be illuminated onto the original, or lights of R, G and B can be illumined simultaneously.

If the invention of the fourteenth aspect is applied, on/off control can be carried out on a circuit-by-circuit basis, where each circuit is formed by light emitting elements being connected in series. Thus, for example, even if a problems arise in one of the light emitting elements within a circuit such as the light emitting element is no longer able to emit light, the effect thereof is limited to that circuit. By controlling the other circuits which are connected in parallel, the function of the light source can be realized and reading of the original can be carried out even if only these other circuits are used.

Further, adjustment of the amount output light of the light source is easy. Thus, adjustment of the amount of light illuminated onto the original is also easy. Moreover, the light emitting elements of the series connected circuit are light emitting elements of the same type, by effecting on/off control on a circuit-by-circuit basis, on/off control per type of light emitting element is made possible. Thus, adjustment of the light amount balance (color balance) of the light illuminated onto the original is also easy.

BRIEF DESCRIPTION OF THE DRAWINGS

FIG. 4 is a perspective view illustrating in detail the structure of a light source section.

FIG. 9 is a cross-sectional view of the LED light source relating to the other embodiment (in a case in which a ceramic substrate is used).

FIG. 13 is a cross-sectional view of the LED light source relating to the other embodiment (in a case in which a metal substrate is used).

DESCRIPTION OF THE PREFERRED EMBODIMENTS

Embodiments of the present invention will be described hereinafter with reference to the drawings. Hereinafter, a digital lab system relating to the present embodiments will be described.

Schematic Structure of Overall System

Figure 1:
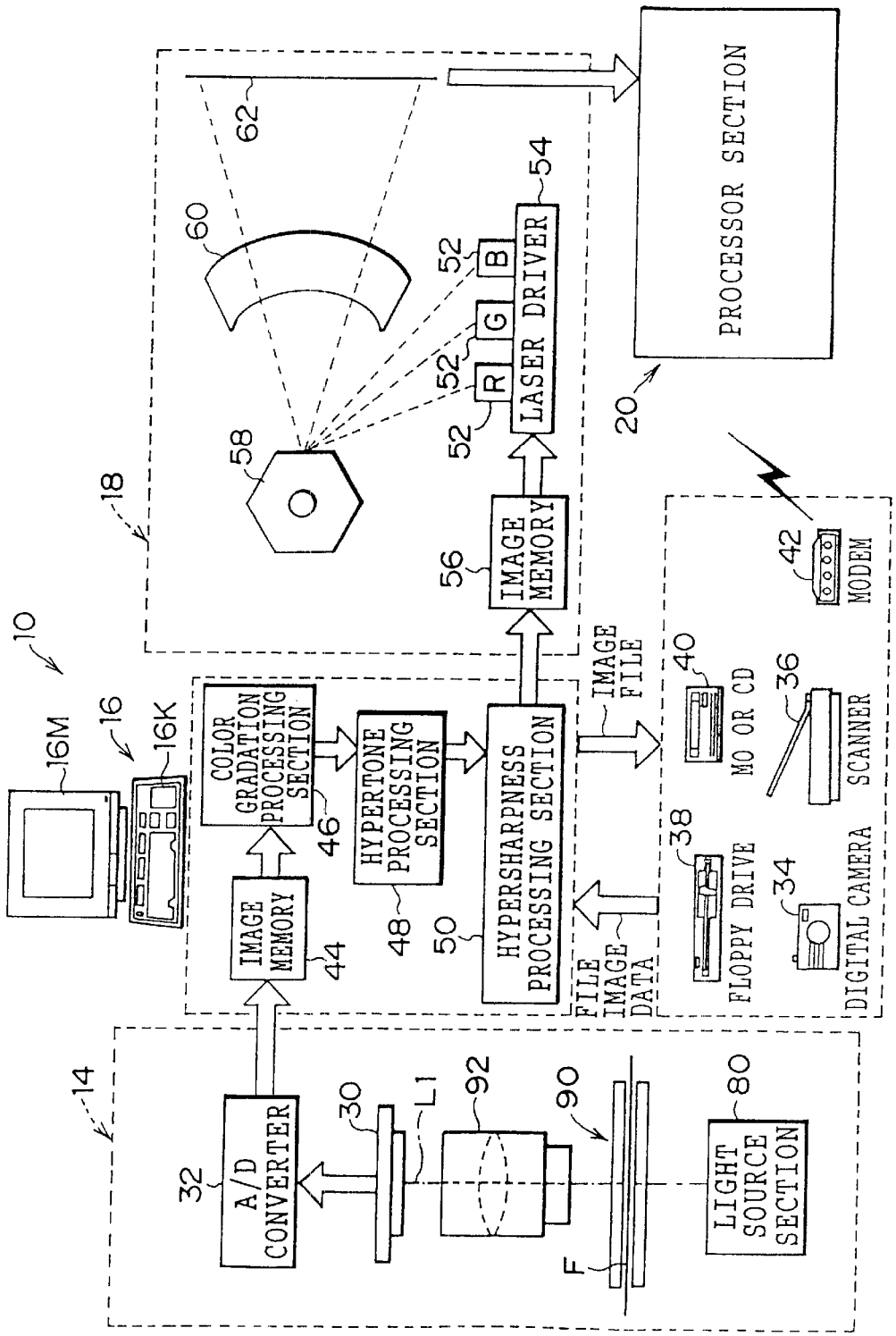
FIG. 1 is a schematic structural view of a digital lab system relating to an embodiment of the present invention.
Figure 2:
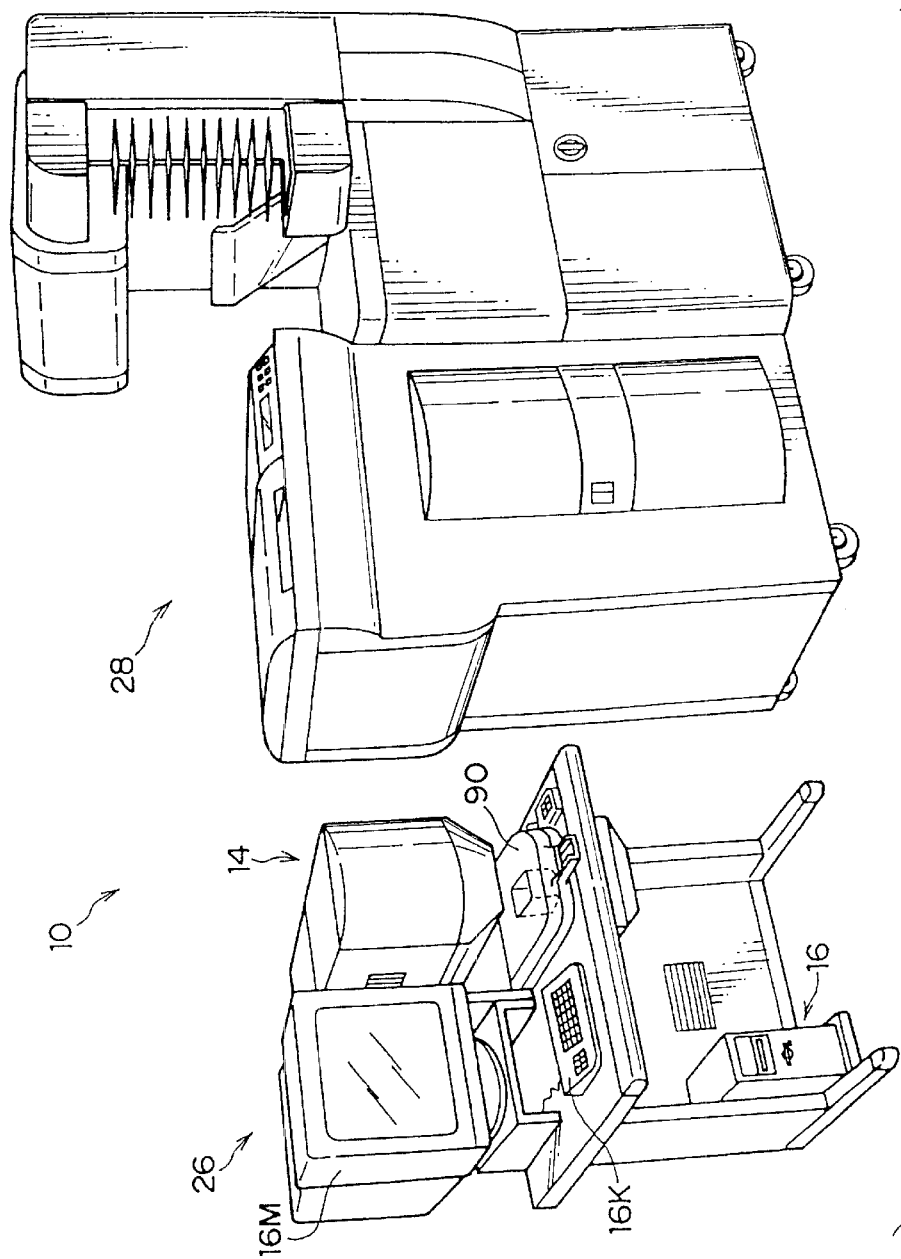
FIG. 2 is a view illustrating the exterior of the digital lab system.

FIGS. 1 and 2 illustrate the schematic structure of a digital lab system 10 relating to the present embodiment.

As illustrated in FIG. 1, the digital lab system 10 includes an area CCD scanner section 14, an image processing section 16, a laser printer section 18, and a processor section 20. The area CCD scanner section 14 and the image processing section 16 are formed integrally as an input section 26 illustrated in FIG. 2. The laser printer section 18 and the processor section 20 are formed integrally as an output section 28 illustrated in FIG. 2.

The area CCD scanner section 14 is for reading a frame image recorded on a photographic film such as a negative film or a reversal film. Examples of photographic films whose frame images can be the object of reading include 135 size photographic films, 110 size photographic films, photographic films on which a transparent magnetic layer is formed (240 size photographic films, known as APS films), and 120 size and 220 size (Brownie size) photographic films.

The area CCD scanner section 14 reads the frame image which is the object of reading by an area CCD 30. After A/D conversion at an A/D converter 32, the image data is outputted to the image processing section 16.

In the present embodiment, explanation will be given of the digital lab system 10 in a case in which a 240 size photographic film (APS film) is used.

The image processing section 16 is structured such that image data (scan image data) outputted from the area CCD scanner section 14 may be inputted to the image processing section 16. Further, image data obtained by photographing by a digital camera 34 or the like, image data obtained by reading an original (e.g., a reflective original) by a scanner 36 (a flat-bed type scanner), image data generated at another computer and stored in a floppy disk drive 38 or an MO drive or CD drive 40, communications image data received via a modem 42, or the like (hereinafter, such image data will be referred to as file image data) may be inputted to the image processing section 16 from the outside.

At the image processing section 16, the inputted image data is stored in an image memory 44, and image processings such as respective types of correction of a color gradation processing section 46, a hypertone processing section 48, a hypersharpness processing section 50 and the like are carried out. The data which has been subjected to image processings is outputted as image data for recording to the laser printer section 18. Further, the image processing section 16 can output image data, which has been subjected to image processing, to the exterior as an image file (e.g., can output the image data onto a recording medium such as an FD, MO, or CD, or can transmit the image data to another information processing device via a communications line, or the like).

The laser printer section 18 is provided with R, G, B laser light sources 52. A laser driver 54 is controlled such that laser light modulated in accordance with the image data for recording which has been inputted from the image processing section 16 (and temporarily stored in an image memory 56) is irradiated onto a photographic printing paper 62. An image is recorded onto the photographic printing paper 62 due to this scanning exposure (in the present embodiment, an optical system mainly using a polygon mirror 58 and an fθ lens 60).

Further, in the processor section 20, the photographic printing paper 62, on which the image has been recorded by scanning exposure in the laser printer section 18, is subjected to various processings such as color developing, bleaching fixing, washing and drying. An image is thereby formed on the photographic printing paper 62.

Structure of Area CCD Scanner

Figure 3:
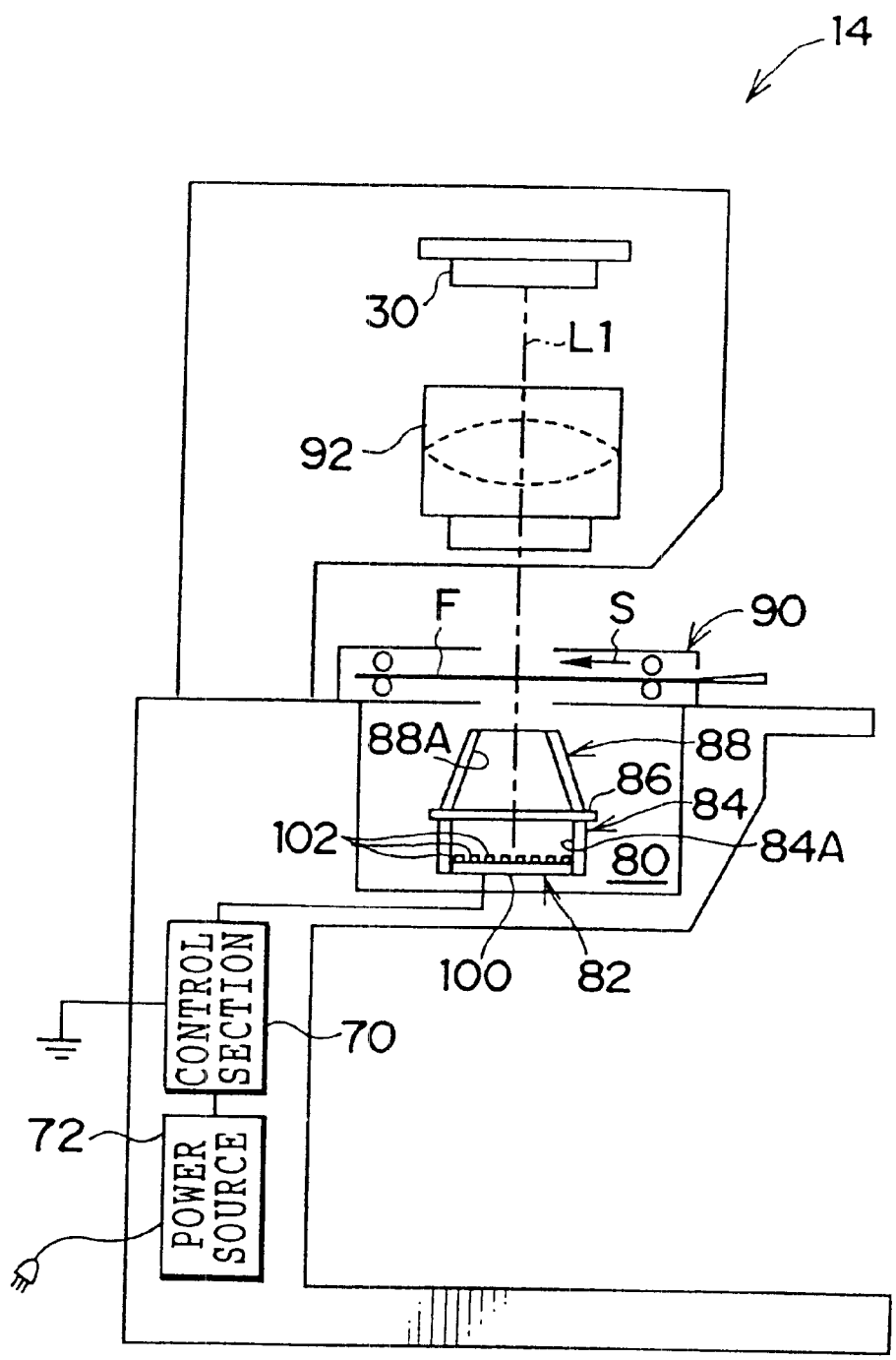
FIG. 3 is a schematic structural view of an area CCD scanner section.

Next, the structure of the area CCD scanner section 14 will be described. FIG. 3 illustrates the schematic structure of an optical system of the area CCD scanner section 14. The optical system includes a light source section 80 which irradiates light onto a photographic film F. A film carrier 90 is disposed at the light emitting side of the light source section 80. The film carrier 90 conveys in a predetermined direction (the direction designated by arrow S) the photographic film F which has been set such that the image surface of the frame image is perpendicular to an optical axis L1 (the optical axis of a lens unit which will be described later and which is a focusing optical system).

As illustrated in FIG. 4, at the light source portion 80, an LED light source 82, a diffusion box 84, a transmission diffusion plate 86 and a waveguide 88 are disposed along the optical axis L1 in that order from the bottom in FIG. 4.

The LED light source 82 is structured such that a plurality of LED elements 102 are arranged two-dimensionally on a substrate 100 (see FIG. 5), and is disposed such that light is emitted in a direction along the optical axis L1. The substrate 100 may be a metal substrate such as an aluminum substrate or a copper substrate, a glass epoxy substrate, or a ceramic substrate such as an alumina substrate, or the like.

A circuit is formed by wires 106 on the surface of the substrate 100 at which the LED elements 102 are disposed. The wires 106 are formed of a material having high electrical conductivity, such as copper. In order to prevent corrosion such as oxidation of the wires 106, the wires 106 are covered by a corrosion-resistance protective film (hereinafter "resist film") 108 (see FIG. 6). The resist film 108 is formed by a highly-reflective material (preferably a material having a reflectance of 90% or more) such as a white material.

Figure 6:
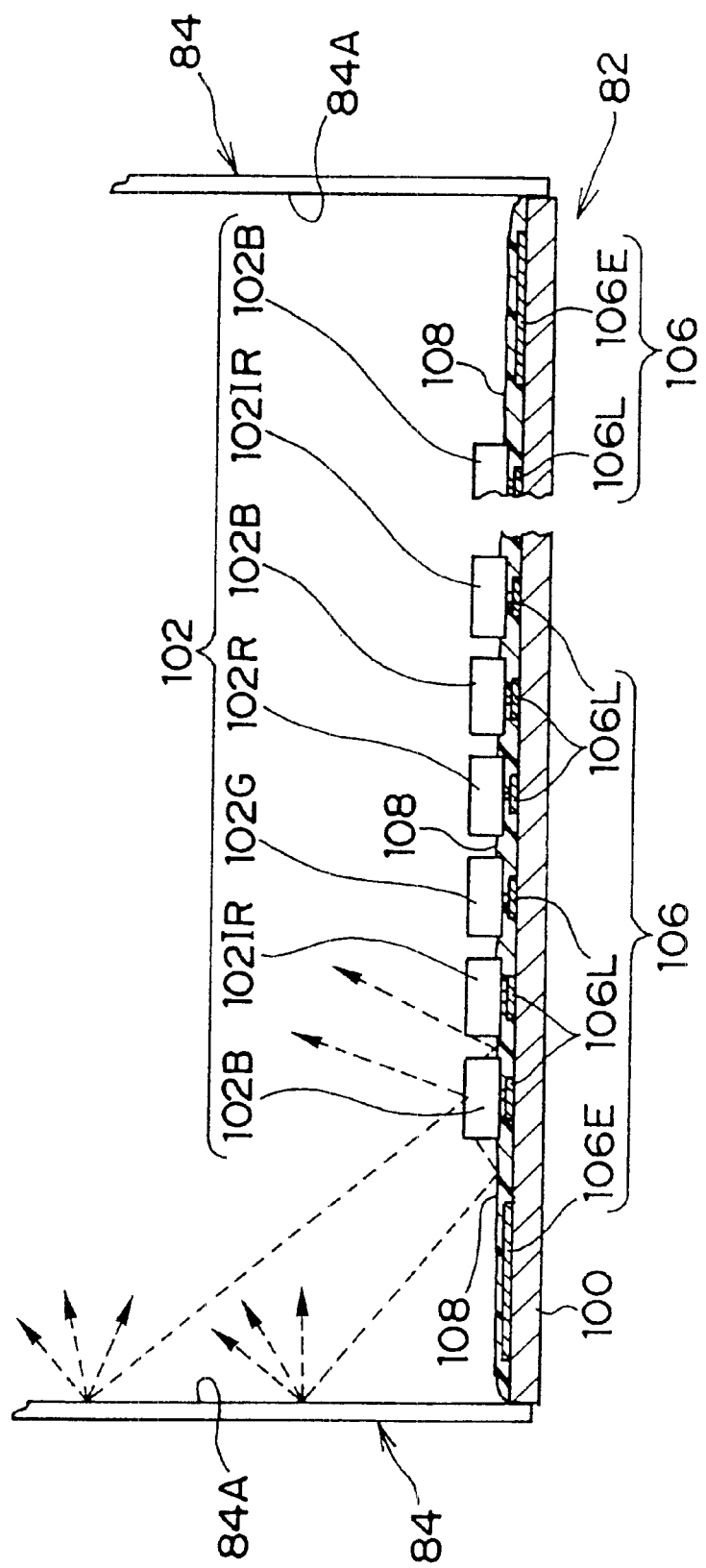
FIG. 6 is a cross-sectional view of the LED light source illustrated in FIG. 5 and a diffusion box.

In this way, at the LED light source 82, a portion of the light emitted from the respective LED elements 102 is emitted in the direction along the optical axis L1 as direct light, whereas another portion of the light is emitted toward the substrate 100, is reflected by the resist film 108, and is guided in the direction along the optical axis L1 as reflected light (refer to the broken lines in FIG. 6).

By the circuit formed by the wires 106, the LED elements 102 on the substrate 100 can be ON/OFF controlled per divisional region, which divisional regions are obtained by dividing the substrate 100 into plural regions. Further, ON/OFF control can be effected per color of the outputted light, e.g., for each of the R, G, B and IR lights.

Figure 5:
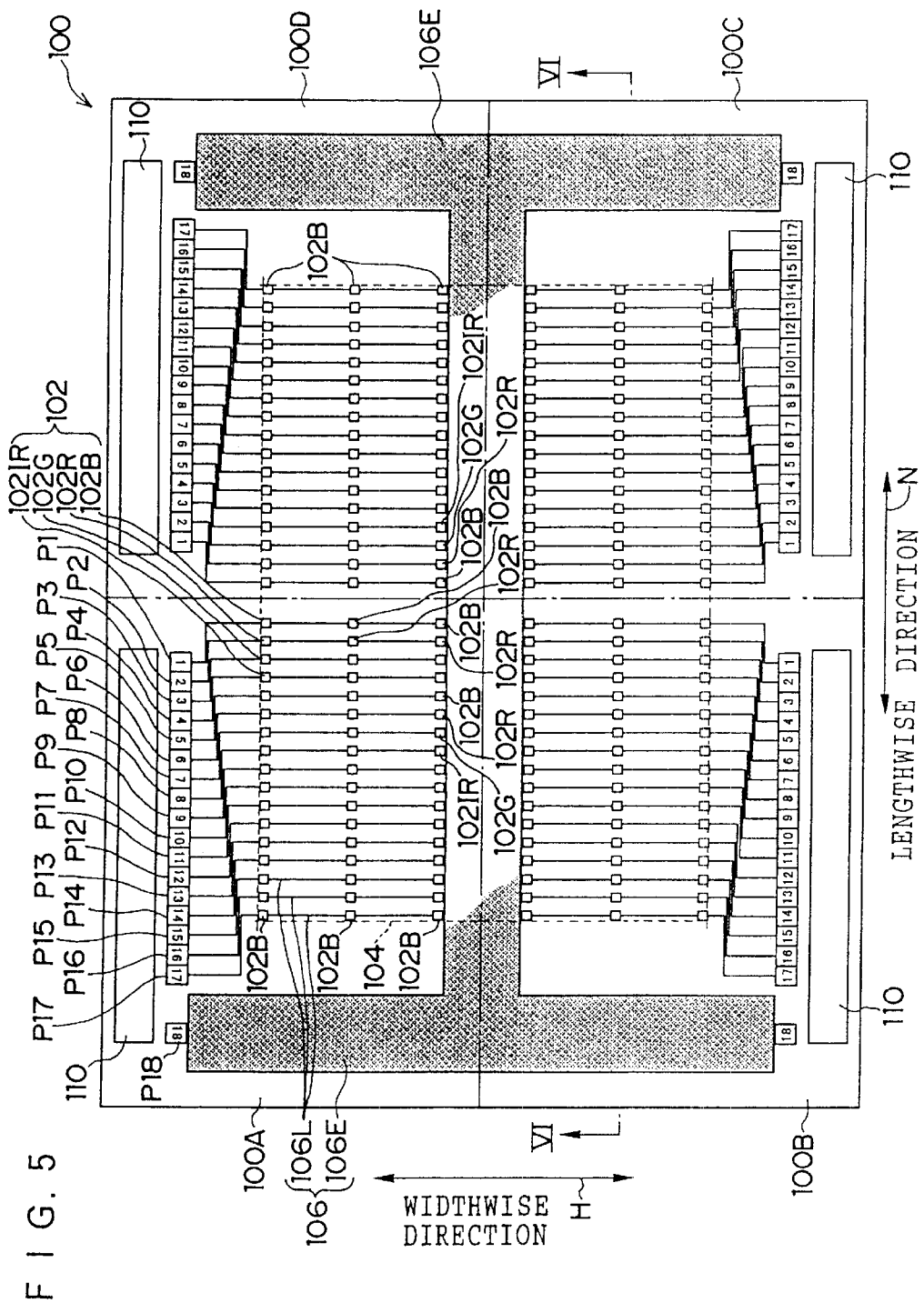
FIG. 5 is a plan view illustrating an example of a wiring pattern (circuit structure) of a substrate of an LED light source and an arrangement of LED elements.

FIG. 5 illustrates an example of a specific structure of the substrate 100.

In FIG. 5, the substrate 100 is used which is formed such that the dimension thereof in the direction denoted by arrow N (hereinafter, the "lengthwise direction") which is parallel to the film conveying direction) is 80 mm, and the dimension thereof in the direction denoted by arrow H (hereinafter, the "widthwise direction") which is perpendicular to the lengthwise direction is 60 mm. LED elements 102 are arranged uniformly and two-dimensionally at a region 104 at the central portion of the substrate 100. The region 104 is 35 mm in the widthwise direction and 50 mm in the lengthwise direction. Further, the wiring pattern (circuit structure) on the substrate 100 and the layout of the LED elements are divided into two regions in the lengthwise direction of the substrate 100 and two regions in the widthwise direction of the substrate 100 to obtain a total of four divisional regions 100A, 100B, 100C, 100D. These divisional regions 100A, 100B, 100C, 100D are formed so as to have line symmetry around the respective dividing lines. Hereinafter, the region 100A will be described in detail.

In the region 100A, along the lengthwise direction, there are 17 rows, each formed by three LED elements 102 being aligned along the widthwise direction. More specifically, LED elements 102B emitting B (blue) light, LED elements 102G emitting G (green) light, LED elements 102R emitting R (red) light, and LED elements 102IR emitting IR (infrared) light are disposed repeatedly in order from the lengthwise direction innermost row. The lengthwise direction outermost side row is a row of LED elements 102B. In the region A, there are fifteen LED elements 102B, twelve LED elements 102R, twelve LED elements 102G and twelve LED elements 102IR. On the entire substrate 100, along the longitudinal direction, there are 34 rows (17 rows×2) each having 6 LED elements (3 LED elements×2), such that there are a total of sixty LED elements 102B, forty-eight LED elements 102R, forty-eight LED elements 102G and forty-eight LED elements 102IR.

Further, the LED elements 102 are disposed such that the plus terminal of each of the LED elements 102 is at the widthwise direction inner side and the minus terminal is at the widthwise direction outer side. The LED elements 102 in each row (i.e., each row of three elements aligned along the widthwise direction) are connected in series by a wire 106L.

A wide wire 106E is provided at the region 100A. The wire 106E is formed so as to extend along the widthwise direction of the substrate 100 at the longitudinal direction end portions of the substrate 100 and at the widthwise direction central portion of the substrate 100 to extend along the longitudinal direction of the substrate 100. At the entire substrate 100, a substantially H-shaped wiring pattern is formed by the wire 106E. The plus terminal of the LED element 102 at the widthwise direction inner side of each row is connected to the wire 106E.

A connector 110 is mounted to a widthwise direction end portion of the region A. Eighteen terminals P1 through P18 are provided in order from the lengthwise direction inner side at the connector 110. The connector 110, i.e., the terminals P1 through P18, are connected to a control section 70 (see FIG. 3) via predetermined cables.

The respective terminals P1 through P17 are connected to the respective end portions of the wires 106L which are connected to the minus terminals of the LED elements 102 at the widthwise direction outer sides of the rows. More specifically, the wires 106L, from the wire 106L which connects in series the LED elements 102 at the row at the lengthwise direction inner side to the wire 106L which connects in series the LED elements 102 at the row at the lengthwise direction outer side, are connected sequentially to the terminals P1 through P17.

The terminal P18 is connected to a power source 72 (see FIG. 3) via a predetermined cable and the control section 70. The terminals P1 through P17 are grounded via predetermined cables and the control section 70.

The control section 70 is provided between the terminal P18 and the power source 72, and effects voltage application control (ON/OFF control) such that voltage of +24V is applied to the terminal P18 from the power source 72. Further, the control section 70 is also connected to the earth, and carries out connection control (ON/OFF control) for connecting the terminals P1 through P17 and the earth.

Namely, by setting the connection between the terminal P18 and the power source 72 ON, a voltage of +24 V is applied to the wire 106E from the terminal P18. Further, by setting the connection of the terminals P1 through P17 and the earth ON, the three LED elements 102 connected in series are connected in parallel, and a voltage of +24V is applied to each row from the wire 106E. Due to this application of voltage, the LED elements 102 emit light in units of rows, such that R, G, B and IR lights are emitted.

Namely, at the control section 70, by selecting the terminals to be grounded, ON/OFF control of each color (the LED elements 102B emitting B light, the LED elements 102G emitting G light, the LED elements 102R emitting R light, and the LED elements 102IR emitting IR light) is possible.

The regions 100B, 100C, 100D have the same structure as that of the region 100A. The connectors 110 of the respective regions 100B, 100C, 100D are also connected via predetermined cables to the control section 70. The respective regions 100A, 100B, 100C, 100D are independently controlled by the control section 70.

At the control section 70, by checking the conductive states of the terminals P1 through P17 and the terminal P18, problems with the wires 106, such as the life of an LED element 102 having expired (known as a "dead" state), can be checked. Even if there are wires with problems, if an amount of output light which enables image reading can be obtained from the LED light source 82, image reading can be carried out after again acquiring shading data.

Returning to FIG. 4, the diffusion box 84 is formed as a rectangular tube whose upper end portion and lower end portion are open, and is set upright at the periphery of the substrate 100 so as to surround the substrate 100. The light emitted from the LED light source 82 enters into the diffusion box 84 without a loss in the amount of light.

A reflection diffusion surface 84A is formed at the inner peripheral surface of the diffusion box 84. The reflection diffusion surface has high reflectance of light and high diffuse reflectance of light, and has a substantially uniform spectral reflection characteristic and spectral diffusion reflection characteristic. "Light" generally means electromagnetic waves in a wavelength band of from 1 nm to 1 mm, but here, light at least within the visible region (a wavelength band of from about 400 nm to 750 nm) is called "light".

The reflection diffusion surface 84A is formed, for example, by coating the inner peripheral surface of the diffusion box 84 with a material having high light reflectance and high diffuse reflectance and a substantially uniform spectral reflection characteristic and spectral diffusion reflection characteristic, or by forming the inner peripheral surface of the diffusion box 84 by using a material having high reflectance and high diffuse reflectance and a substantially uniform spectral reflection characteristic and spectral diffusion reflection characteristic.

In the present embodiment, the reflection diffusion surface 84A is formed by using a resin reflection diffusion surface, specifically, a hyperfinely foamed reflection plate MCPET (trade name) manufactured by Furukawa Denki Kogyo CO., LTD whose reflectance of light in the visible region is 99% (96% of which is diffusion reflection), and which can substantially uniformly reflect light of wavelengths of from 400 nm to 750 nm.

The diffusion box 84 guides light emitted from the LED light source 82 upward and emits the light toward a transmission diffusion plate 86. At this time, by diffusing and reflecting the light in random directions by the reflection diffusion surface 84A, non-uniformity of the light amount of the light from the LED light source 82 can be reduced (the non-uniform light amount distribution can be corrected). Further, at the reflection diffusion surface 84A, light is diffused and reflected without varying the relative light amount balance (so-called color balance) of the RGB lights emitted from the LED light source 82. Thus, the light can exit from the diffusion box 84 with substantially the same light amount balance as that of the light emitted from the LED light source 82.

The transmission diffusion plate 86 is provided so as to contact the top end portion of the diffusion box 84, so that the opening of the top end portion of the diffusion box 84 is closed. The light exiting from the diffusion box 84 is incident on the transmission diffusion plate 86 without a loss in the amount of light.

The transmission diffusion plate 86 is formed by, for example, a milky-white-color plate, an LSD (light shaving diffuser), or the like, and is disposed such that the optical central axis thereof coincides with the optical axis L1.

By diffusing and transmitting the light which has exited from the diffusion box 84, the transmission diffusion plate 86 makes the light into diffused light which spreads in random directions. The light amount distribution of the light is made uniform, and the light along the optical axis L1 is emitted toward the waveguide 88.

The waveguide 88 is formed as a column whose top end portion and bottom end portion are open, and whose length and width become shorter from the bottom end toward the top end. The opening at the top end of the waveguide 88 is formed in a rectangle so as to substantially correspond to the frame image of the photographic film F. The waveguide 88 is disposed such that the optical central axis thereof coincides with the optical axis L1 and such that the bottom end portion of the waveguide 88 is closed by the transmission diffusion plate 86. The light transmitted through the transmission diffusion plate 86 enters into the waveguide 88 without a loss of the amount of light.

A reflecting surface 88A having high light reflectance is formed at the inner peripheral surface of the waveguide 88. The light, which has been transmitted through the transmission diffusion plate 86 and has entered into the waveguide 88, is guided to a vicinity of the film carrier 90, and is emitted toward the photographic film F supported at a reading position R within the film carrier 90, as light (illumination light) corresponding to the frame image which is the object of reading. This illumination light is a bundle of light beams which are symmetrical around the optical axis L1.

As illustrated in FIG. 3, an opening, which corresponds to the frame image set at the reading position R and which is for allowing light from the light source portion 80 to pass through, is formed in each of the top surface and the bottom surface of the film carrier 90. The light emitted from the light source portion 80 (more specifically, from the diffusion box 84) passes through the opening formed in the bottom surface of the film carrier 90, is irradiated onto the photographic film F, and light of a light amount corresponding to the density of the frame image supported at the reading position R is transmitted through the photographic film F. The light which has been transmitted through the photographic film F exits through the opening formed in the upper surface of the film carrier 90.

At the side of the photographic film F opposite the side at which the light source portion 80 is located, a lens unit 92 and an area CCD 30 are disposed in that order along the optical axis L1. The lens unit 92 focuses the light which has been transmitted through the frame image. A single lens is illustrated as the lens unit 92. However, the lens unit 92 is actually a zoom lens formed from a plurality of lenses. Or, a Selfoc lens may be used as the lens unit 92. In this case, it is preferable to have the end surfaces of the Selfoc lens be as close to the photographic film F and the area CCD 30 as possible.

A plurality of CCD cells are arranged in two dimensions at the light incident side of the area CCD 30, and a sensing portion having an electronic shutter mechanism is also provided at the light incident side of the area CCD 30. The area CCD 30 is disposed such that the light receiving surface of the sensing portion coincides with the focusing point position of the lens unit 92. Further, although not illustrated, a shutter is provided between the area CCD 30 and the lens unit 92.

The area CCD 30 detects density information of the frame image positioned at the reading position R of the film carrier 90, and outputs the density information to the A/D converter 32 (see FIG. 1) as an image signal. The A/D converter 32 digitally converts the image signal from the area CCD 30, and transmits the digital signal to the image processing section 16 as image data.

Operation

Next, operation of the present embodiment, which is structured as described above, will be explained.

At the area CCD scanner section 14, the IR image signal and the RGB image signals, which correspond to the image density of the frame image set at the reading portion R of the film carrier 90, are acquired by the area CCD 30. The image signals are digitally converted by the A/D converter 32, and the converted digital signals are transmitted to the image processing section 16.

The image processing section 16 stores the received data in the image memory 44 as image data. At the image processing section 16, correction for eliminating effects of scratches and dust on the photographic film F is carried out on the RGB image data on the basis of the IR image data. Further, image processings such as various types of correction, e.g., color gradation processing, hypertone processing, hypersharpness processing and the like, are carried out. Thereafter, the image data is outputted to the laser printer section 18 as image data for recording.

At the laser printer section 18, the laser light which is modulated in accordance with the image data for recording is illuminated onto the photographic printing paper 62, such that an image is recorded onto the photographic printing paper 62 by scanning exposure. The photographic printing paper 62, on which the image was recorded by scanning exposure at the laser printer section 18, is conveyed to the processor section 20, and is subjected to various processing such as color developing, bleaching fixing, washing and drying, such that an image is formed on the photographic printing paper 62.

Next, image reading processing by the area CCD scanner section 14 will be described in further detail.

The photographic film F is set, and when the frame image which is the object of reading is set at the reading position R, at the area CCD scanner section 14, the region to be lit is selected from the regions A, B, C, D in accordance with the type of the photographic film F. Via the predetermined cable, the power source 72 and the terminal P18 of the connector 110 of the selected region to be lit are connected, and a voltage of +24V is applied to the wire 106E.

Next, via the predetermined cables, the terminals P1, P5, P9, P13, P17 of the connector 110 of the region to be lit are grounded for a predetermined period of time. In this way, voltage is applied (electricity is supplied) to the parallel-connected LED elements 102B by the wires 106L which are connected to the terminals P1, P5, P9, P13, P17. In the one selected region to be lit, 5 rows of (i.e., 15) LED elements 102B emit light for a predetermined period of time, and blue (B) light is emitted from the LED light source 82 along the optical axis L1.

Because the region to be lit can be selected, for example, in the case of a photographic film F whose image can be read even if the amount of illuminated light is low, only the (15) LED elements 102B of the region 100A are lit. In the case of a photographic film F which requires a large amount of illuminated light, all of the (60) LED elements 102B of the regions 100A, 100B, 100C, 100D are lit.

At this time, the light emitted from the LED light source 82 includes direct light from the respective LED elements 102B, and reflected light which has been emitted from the respective LED elements 102B and reflected by the resist film 108.

The B light emitted from the LED light source 82 enters into the diffusion box 84; is diffused and reflected by the reflection diffusion plate 84A, and is diffused and transmitted through the transmission diffusion plate 86. In this way, the light becomes diffuse light which spreads in random directions, and the light amount distribution per unit surface area is made uniform. The light which has passed through the transmission diffusion plate 86 is, by the waveguide 88, guided to a vicinity of the film carrier 90 and formed into illumination light substantially corresponding to the frame image which is the object of reading. The light is emitted toward the photographic film F which is supported at the reading position R within the film carrier 90.

The light which is emitted from the waveguide 88 (the light source section 80) passes through the opening formed in the bottom surface of the film carrier 90, and is illuminated onto the frame image of the photographic film F set at the reading position R. Light based on the density of the frame image is transmitted through the photographic film F. The light which has been transmitted through the photographic film F passes through the opening formed in the top surface of the film carrier 90, and exits from the film carrier 90.

The light, which exits from the film carrier 90 and is carrying the frame image information, becomes a bundle of light beams which are symmetrical about the optical axis L1, is incident on the lens unit 92, and is sensed by the area CCD 30. The image signal, which is based on the image density and obtained by the area CCD 30, is digitally converted and is subjected to correction based on shading data. Thereafter, the image data is transmitted to the image processing section 16 as B image data.

Next, via the predetermined cables, the terminals P2, P6, P10, P14 of the connector 110 of the selected region are grounded for a predetermined period of time. In this way, voltage is applied (electricity is supplied) to the parallel-connected LED elements 102R by the wires 106L which are connected to the terminals P2, P6, P10, P14.

In this way, in the one selected region to be lit, 4 rows of (i.e., 12) LED elements 102R emit light for a predetermined period of time, and R light is emitted from the LED light source 82 along the optical axis L1. The R image data is acquired in the same way as the B image data.

Next, via the predetermined cables, the terminals P3, P7, P11, P15 of the connector 110 provided at the selected region are grounded for a predetermined period of time. In this way, in the one selected region to be lit, 4 rows of (i.e., 12) LED elements 102G emit light for a predetermined period of time, and G light is emitted from the LED light source 82 along the optical axis L1. The G image data is acquired in the same way as the B image data.

Finally, via the predetermined cables, the terminals P4, P8, P12, P16 of the connector 110 provided at the selected region are grounded for a predetermined period of time. In this way, in the one selected region to be lit, 4 rows of (i.e., 12) LED elements 102IR emit light for a predetermined period of time, and IR light is emitted from the LED light source 82 along the optical axis L1. The IR image data is acquired in the same way as the B image data.

Even if a problem occurs in any of the wires 106 such as the life of an LED element 102 expiring, and the number of LED elements 102 which are lit decreases, if an output light amount of a predetermined amount or more can be obtained, the above-described image reading processing can be carried out. At the area CCD scanner section 14, the number of wires in which problems have arisen is monitored, and a determination is made as to whether image reading processing can be carried out or not.

More specifically, the number of wires in which problems have arisen (defective wires) is monitored for each of the R, G, B and IR. Even if another wire becomes defective, if the total number of defective wires of each of R, G, B and IR is a predetermined number (2 in the present embodiment) or less, shading data is again acquired, and image reading processing is continued. If the number of defective wires among any one of R, G, B and IR becomes more than the predetermined number, an error message for urging the user to replace the LED light source 82 or the like is output.

As described above, in the present embodiment, the surface of the substrate 100 on which the LED elements 102 are disposed is covered by a resist film 108 having a high reflectance, e.g., a white resist film. In this way, the light emitted from the LED elements 102 toward the substrate 100 can be reflected toward the photographic film F. Thus, at the LED light source 82, almost all of the light emitted from the LED elements 102 can be emitted toward the photographic film F, and not only direct light but also reflected light can be utilized as light for illuminating the photographic film F. Thus, light can be utilized efficiently. Further, by using the reflected light, non-uniformity of the light amount distribution of the direct light is corrected (non-uniformity of the light amount is reduced).

The diffusion box 84 is disposed so as to enclose the periphery of the LED light source 82. Due to the light reflection diffusion plate 84A of the diffusion box 84, the light which is emitted from the LED light source 82 and enters into the diffusion box 84 is guided toward the photographic film F (toward the transmission diffusion plate 86) while being diffused and reflected. In this way, light can be guided while being collected, without loss of the light entering from the LED light source. Further, the non-uniformity of the light amount distribution can be corrected even more (the non-uniformity of the light amount can be reduced).

The light, which has been guided toward the photographic film F and emitted from the diffusion box 84, is diffused and transmitted by the transmission diffusion plate 86, and is emitted toward the photographic film F (toward the waveguide 88). In this way, the non-uniformity of the light amount distribution of the light emitted from the LED light source can be corrected even more (the non-uniformity of the light amount can be reduced), such that substantially uniform light can be irradiated onto the photographic film F.

The substrate 100 is divided into plural regions (in the present embodiment, the four regions which are regions 100A, 100B, 100C, 100D). Lighting control of the LED elements 102 can be carried out per divisional region. In this way, for example, regions in which the LED elements 102 are to be lit are selected in accordance with the type of the photographic film F which is the object of reading. In a case of a photographic film F whose image can be read even if the light amount of the illumination light is low, the number of LED elements 102 to be lit can be controlled such that, for example, only the LED elements 102 of the region 100A are lit. In this way, it is possible to reduce the amount of energy consumed.

Moreover, the (series-connected) LED elements 102 of each row are connected in parallel, and ON/OFF control can be carried out per row. In this way, for example, if the life of one of the LED elements 102 has expired and that LED element 102 cannot be lit, the effect thereof is confined to only the row (wire) in which that LED element 102 is included. If output of a predetermined light amount or more can be obtained by the lighting of the other rows of LED elements 102, image reading processing can be continued although there will be the need to obtain shading data again.

In the above description, the light emitted from the LED elements 102 toward the substrate is reflected toward the photographic film F by the resist film 108. However, the present invention is not limited to the same. Any structure can be utilized provided that the light emitted from the LED elements toward the substrate can be reflected.

Figure 7:
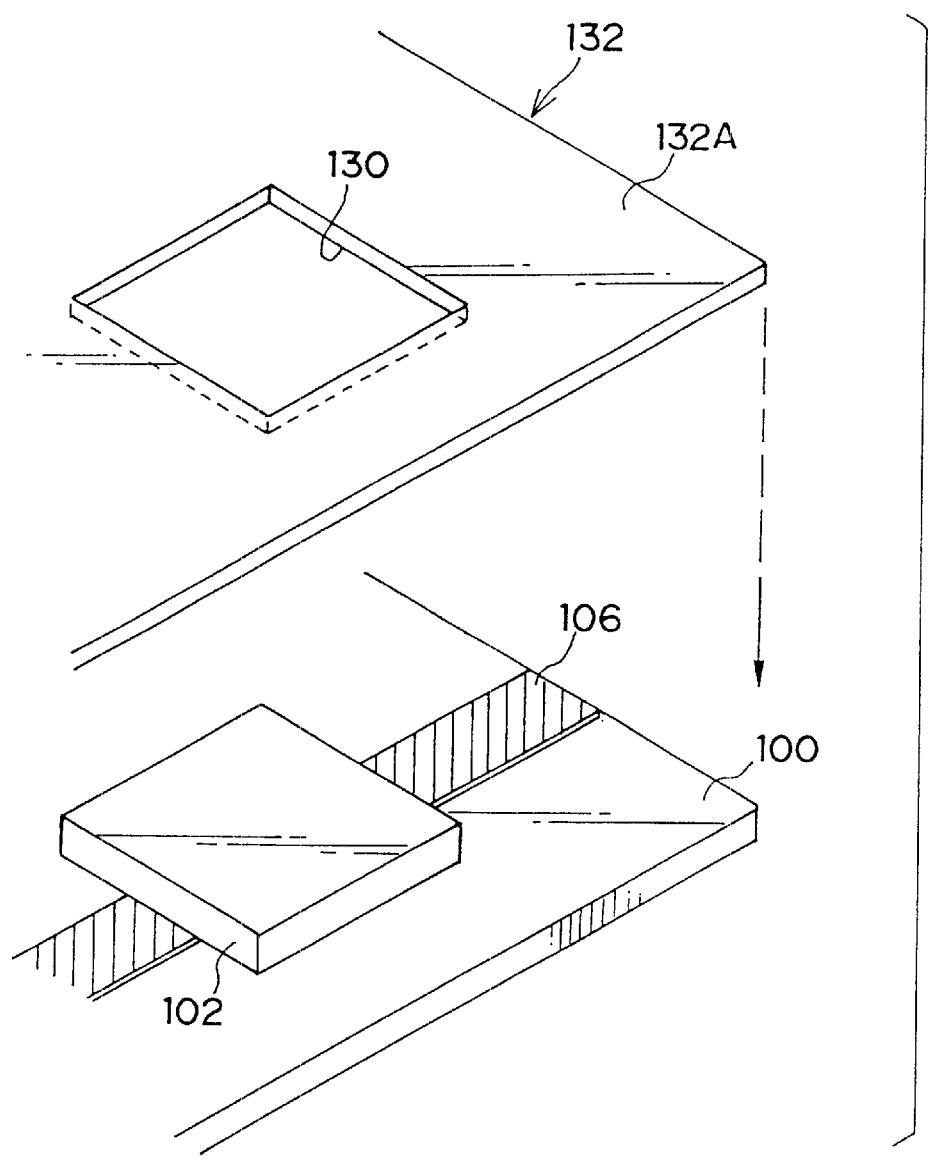
FIG. 7 is a schematic view illustrating an LED light source relating to another embodiment of the present invention.

For example, as illustrated in FIG. 7, a reflecting plate 132, in which openings 130 corresponding to the size of the LED elements 102 are formed. at positions corresponding to positions at which LED elements 102 are disposed on the substrate 100, may be provided on the surface of the substrate 100 at which the LED elements 102 are provided, such that a light reflecting surface 132A of the reflecting plate 132 is the top surface (facing in the direction of the photographic film F).

In this case, a portion of the light emitted from the LED elements 102 is emitted toward the photographic film F (toward the diffusion box 84) as direct light. Another portion of the light, i.e., the light emitted toward the substrate 100, is reflected by the light reflecting surface 132A, becomes reflected light, and is emitted toward the photographic film F (toward the diffusion box 84). Accordingly, in the same way as the case in which light is reflected by the resist film 108, the efficiency of utilizing the light improves, and non-uniformity of the light amount of the light source can be reduced.

At this time, if the light reflecting surface 132A is formed such that not only the reflectance but also the diffuse reflectance is high in the same way as the reflection diffusion surface 84A, the non-uniformity of the light amount can be reduced even more. Further, if the light reflecting surface 132A is formed so as to have a substantially uniform spectral reflection characteristic and spectral diffusion reflection characteristic (e.g., in the same way as the reflection diffusion surface 84A), there is hardly any variation in the light amount balance due to reflection. Therefore, it is easy to control the output light amount of the LED light source 82.

In the above description, a case is described in which the substrate 100 is used in which the reflectance of the surface of the substrate 100 on which surface the LED elements are disposed is low (the surface of the substrate 100 is a color having a low reflectance, for example, dark green). However, when the degree of whiteness of the surface of the substrate is high, as in the case in which a white ceramic substrate using a white ceramic is used, the reflectance is high. Thus, the same effects (improvement in the efficiency of utilizing light, reduction in non-uniformity of the light amount of the light source) can be obtained even if the resist film 108 and the reflection plate 132 and the like are not used.

Figure 8:
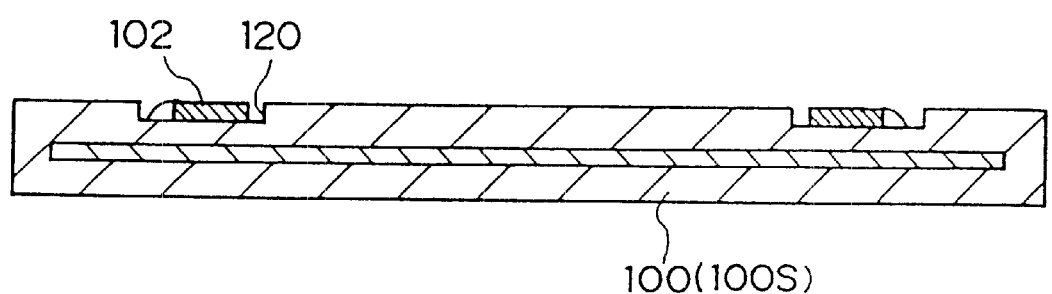
FIG. 8 is a cross-sectional view of the LED light source relating to the other embodiment (in a case in which a ceramic substrate is used).

Ceramic has the features of having good thermal conductivity and being an insulator. Further, ceramic has the feature that it can easily be formed into a desired configuration. By using these features, as illustrated in FIG. 8, in a case in which a ceramic substrate 100S is used as the substrate 100, the ceramic substrate 100S is formed such that recess portions 120 are provided at the positions at which the LED elements 102 are to be disposed, and the LED elements 102 are disposed in the recess portions 120. In this way, breakage of the LED elements 102 can be prevented.

Further, as illustrated in FIG. 9, after the LED elements 102 are placed, a resin such as silicon resin or epoxy resin is made to flow into the recess portions 120 and hardens the resin, so as to form a protective resin layer 122. In this way, the moisture-resistance can be improved, and corrosion of the wires 106 and the like can be prevented. Further, in order to bond the light emitting elements to the substrate, generally, conductive wires made of aluminum or the like are used. Thus, the protective resin layer 122 must be insulative.

Figure 10A:
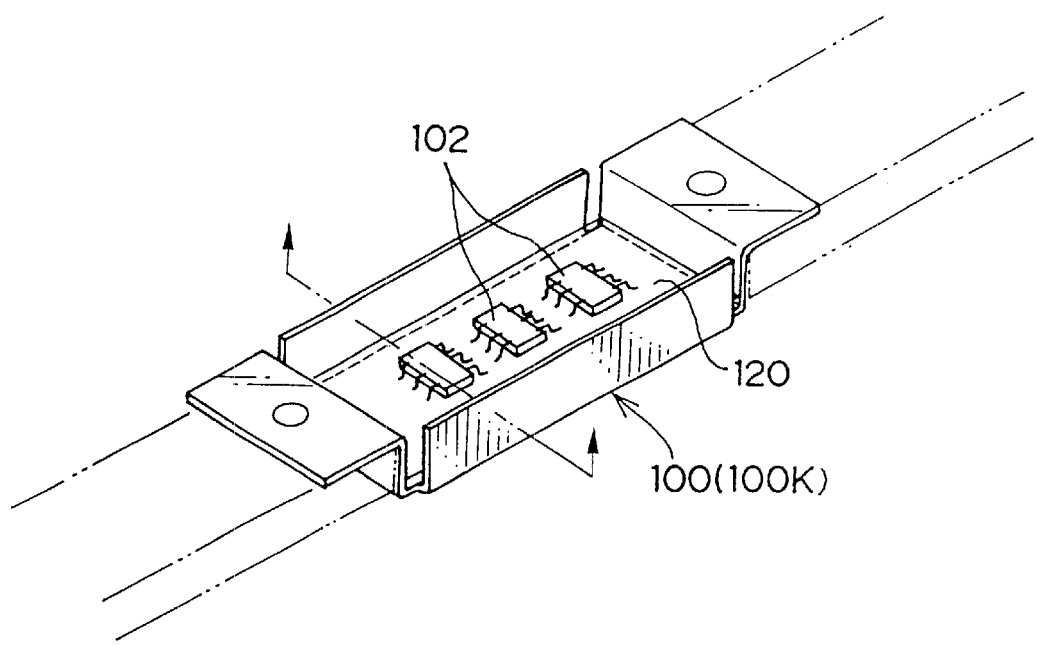
FIG. 10A is a perspective view of the LED light source relating to the other embodiment (in a case in which a metal substrate is used).
Figure 10B:
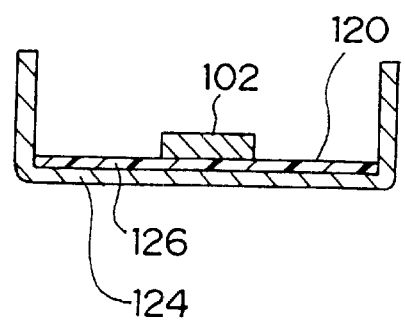
FIG. 10B is a cross-sectional view of the LED light source relating to the other embodiment (in a case in which a metal substrate is used).

On the other hand, in the case in which a metal substrate 100K such as an aluminum substrate or a copper substrate is used, an insulating layer 126 is provided on the surface of a metal plate 124 which is a base. The LED elements 102 are bonded onto the insulating layer 126, and thereafter, the metal plate 124 (insulating layer 126) is pressed. Thus, the recess portions 120 can be formed at the positions at which the LED elements 102 are disposed (see FIGS. 10A and 10B). In this way, in the same way as the ceramic substrate 100S, breakage of respective elements can be prevented.

Further, if a resin is made to flow into the recess portions 120 so as to form a protective resin layer 122, even in the case of the metal substrate 100K, corrosion can be prevented in the same way as the case of the ceramic substrate 100S.

Figure 11:
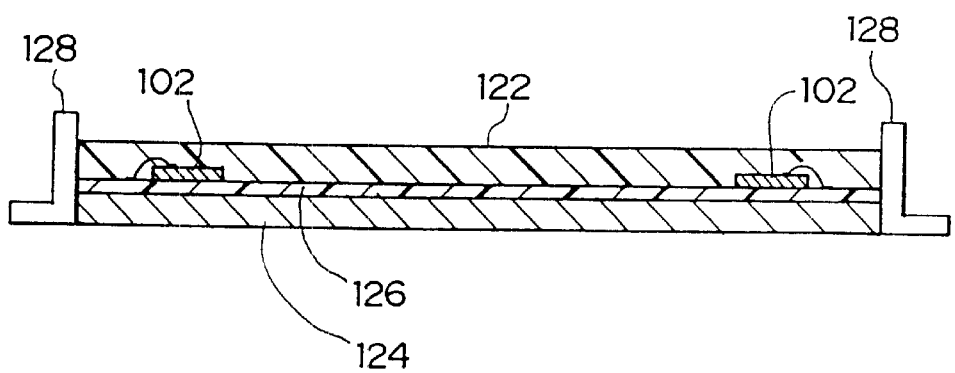
FIG. 11 is a cross-sectional view of the LED light source relating to the other embodiment (in a case in which a metal substrate is used).

Further as illustrated in FIG. 11, the protective resin layer 122 can be formed at the entire surface of the metal substrate 100K by using a mold 128. (Namely, a mold 128 is mounted to the peripheral edge of the metal substrate 100K so as to surround the metal substrate 100K. After resin has been made to flow into a surrounded portion surrounded by the mold 128 and has hardened, the mold 128 is removed.) In this way, the protective resin layer 122 can be formed at the entire surface of the metal substrate 100K on which the LED elements 102 are provided, so as to cover the LED elements 102 provided on the metal substrate 100K. At this time, if the protective resin layer 122 is formed by a hard resin such as epoxy resin, both effects of breakage-resistance and corrosion-resistance can be achieved.

Figure 12:
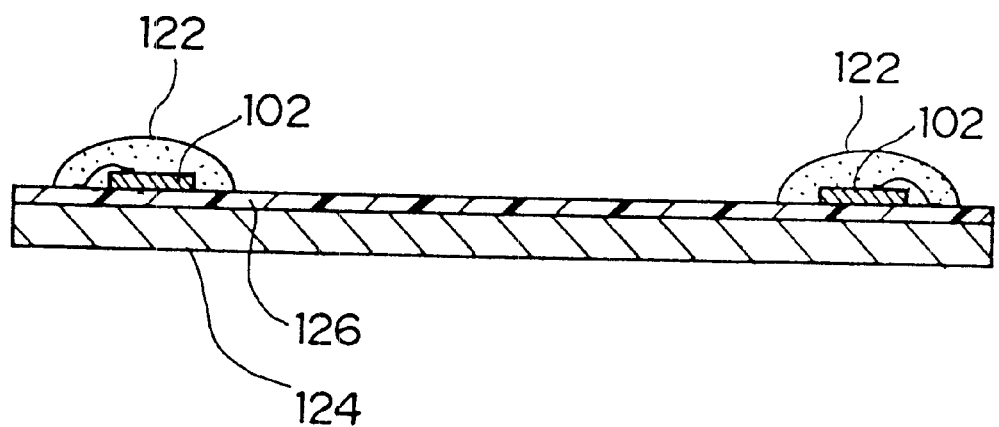
FIG. 12 is a cross-sectional view of the LED light source relating to the other embodiment (in a case in which a metal substrate is used).

Or, as illustrated in FIG. 12, the protective resin layer 122 may be formed at one portion of the surface of the metal substrate 100K at which the LED elements 102 are provided, so as to cover at least the LED elements 102.

As illustrated in FIG. 13, in order to prevent the LED elements, the wires or the like from going out due to thermal deformation, the LED elements 102 may be covered by a first protective resin layer 122A formed of a flexible resin such as silicon resin. Thereafter, in order to prevent breakage, the entire surface of the metal substrate 100K at which the LED elements 102 are provided may be covered by a second protective resin layer 122B, which is formed of a hard resin such as epoxy resin, such that the surface is made flat in a manner such as that described above.

By taking measures to prevent breakage and prevent corrosion in this way, the number of times the LED light source 82 must be replaced can be decreased, such that the operating costs can be decreased.

Moreover, if the protective resin layer 122 is a milky-white color (e.g., if the protective resin layer 122 is formed from the above-described resin mixed with a diffusion material), breakage and corrosion can be prevented, and non-uniformity of the light amount can be suppressed. If the protective resin layer 122 is colored (e.g., if the protective resin layer 122 is formed from the above-described resin mixed with a pigment), the wavelength of the light can be shifted.

If the protective resin layer 122 is formed after the substrate 100 has been covered by the resist film 108, in addition to the effects of prevention of breakage and prevention of corrosion, effects such as an improvement in the efficiency of utilizing light and a decrease in the non-uniformity of the light amount of the light source can also be achieved.

Figure 14:
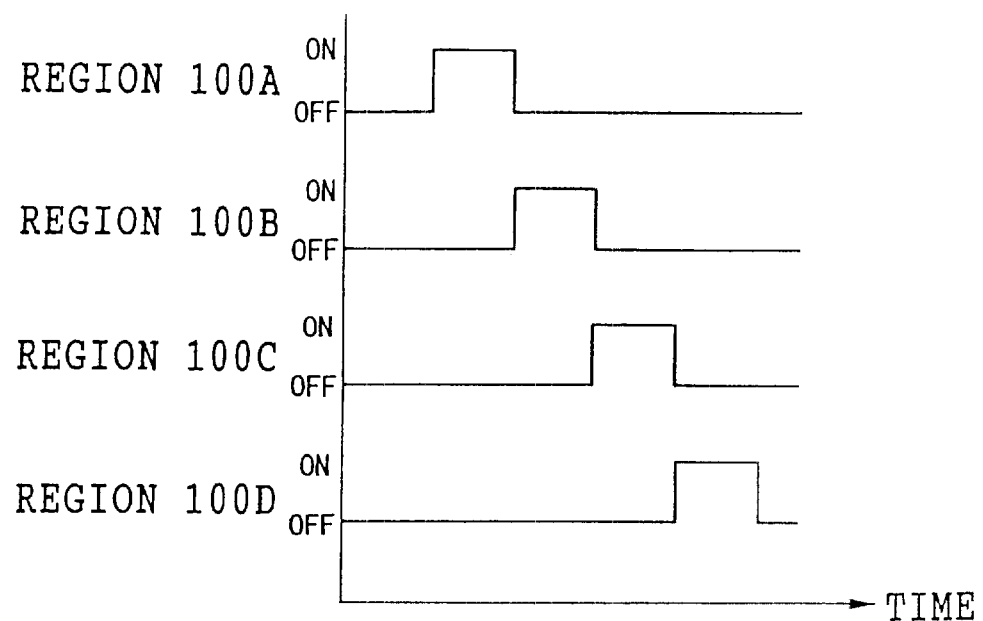
FIG. 14 is a timing chart illustrating ON/OFF control per unit region of the LED light source relating to the other embodiment of the present invention.

In the above, a case is described in which the region, whose LED elements 102 are to be lit, is selected in accordance with the type of the photographic film F. However, the present invention is not limited to the same. For example, when the respective image data of R, G, B and IR are acquired, the LED elements 102 may be lit with the pulses thereof being staggered per region, as illustrated in FIG. 14 (e.g., first only LED elements 102 of one region are lit and then turned off, and thereafter, only the LED elements 102 of another region are lit and then turned off, and thereafter, only the LED elements 102 of yet another region are lit and then turned off, and thereafter, only the LED elements 102 of still another region are lit and then turned off.) Due to such pulse-lighting, the life of the LED elements 102 (i.e., the LED light source 82) can be extended, and the amount of light outputted per LED element can be made greater than a case in which the LED elements are lit in a usual manner.

Further, in the above, the LED light source 82, which is formed such that a single substrate 100 is divided into plural regions (regions A, B, C, D in the above description), is described as an example. However, the present invention is not limited to the same. A substrate may be provided per region such that the LED light source 82 is formed by a plurality of substrates. In this case, the ON/OFF control of the LED elements may of course be carried out per substrate, and manufacturers can manufacture the LED light sources in units of substrates. Thus, the number of defective products can be reduced. Further, replacement necessitated by the LED elements expiring or the like can be carried out on a substrate-by-substrate basis.

Further, in the above, the light source section 80 provided with the waveguide 88 is described as an example, but the present invention is not limited to the same, and the waveguide 88 may be omitted. At this time, the diffusion box 84 may be formed such that the length and width thereof gradually become shorter from the lower end portion to the upper end portion, so that the configuration of the upper end opening can be substantially identical to the size of the frame image of the photographic film F. In this way, the function of the waveguide 88 can be borne by the diffusion box 84.

Further, in the above, although the same number of LED elements 102 are provided per row (three per row in the embodiment), the present invention is not limited to the same. For example, the amount of electricity consumed by the LED elements 102 differs in accordance with the type thereof (differs in accordance with whether the LED element 102 is the LED element 102R, 102G, 102B, or 102IR). Thus, the number of LED elements provided per row can be varied in accordance with the amount of electricity consumed per type of LED element 102.

Moreover, in the above, the LED elements 102 forming a row are all the same type. However, the LED elements 102 forming a row do not have to be the same type.

In the above description, the LED elements 102IR which emit IR light are included in order to detect scratches and dust on the photographic film F. However, these LED elements 102IR may be omitted.

Further, in the above, the area CCD scanner section, in which an image is read by the photographic film F being illuminated with the R, G, B and IR lights being illuminated one after the other, is described as the image reading device. However, the present invention is also applicable to an image reading device in which the R, G, B and IR lights are irradiated simultaneously onto the photographic film F and the R, G, B and IR images are read simultaneously.

In the above description, description is given of the area CCD scanner section (a so-called transmission image reading device) which reads an image by light which is transmitted through the photographic film F. However, the present invention is also applicable to reflection original reading devices which read an image by reflected light.

As described above, in the present invention, light can be emitted uniformly and with a low loss of the amount of light, by using the minimum amount of light emitting elements required.

What is claimed is:

1. An original reading device comprising:

a light source structured by a plurality of light-emitting elements being connected to predetermined positions of a wiring pattern formed in advance on a substrate, said light source including a reflecting member provided at a position of the substrate other than positions at which the plurality of light-emitting elements are disposed on the substrate, said reflecting member having a reflectance which is higher than a reflectance of the substrate, wherein light from the light source is illuminated onto an original, and one of a transmitted image and a reflected image is read by photoelectric converting elements.

2. An original reading device according to claim 1, wherein said reflecting member is a film which is of a substantially white color and which protects a surface of the substrate.

3. An original reading device according to claim 1, wherein said reflecting member is a reflective plate which is provided on the substrate.

4. An original reading device comprising:

a light source structured by a plurality of light-emitting elements being connected to predetermined positions of a wiring pattern formed in advance on a substrate, wherein a surface of the substrate on which the light-emitting elements are disposed is substantially white, wherein light from the light source is illuminated onto an original, and one of a transmitted image and a reflected image is read by photoelectric converting elements.

5. An original reading device according to claim 4, wherein the substrate is a ceramic substrate.

6. A light source structured by a plurality of light-emitting elements being connected to predetermined positions of a wiring pattern formed in advance on a substrate, said light source comprising:

a reflecting member provided at a position of the substrate other than positions at which the plurality of light-emitting elements are disposed on the substrate, said reflecting member having a reflectance which is higher than a reflectance of the substrate, and a tube-shaped light collecting member which is provided at a surface side of the substrate at which the light-emitting elements are disposed, and which encompasses the substrate, and whose inner peripheral surface is a reflection diffusion surface having a reflectance of substantially 100% and a diffuse reflectance of substantially 100%.

7. A light source structured by a plurality of light-emitting elements being connected to predetermined positions of a wiring pattern formed in advance on a substrate, wherein the substrate has at least one recess portion which is formed to be deeper than a heightwise dimension of the light emitting element, and at least one light emitting element is disposed in the recess portion.

8. A light source according to claim 7, further comprising a protective resin layer which is insulative and covers at least the light emitting element within the recess.

9. A light source structured by a plurality of light-emitting elements being connected to predetermined positions of a wiring pattern formed in advance on a substrate, said light source comprising:

a protective resin layer which is insulative and covers one of a portion of and all of a surface of the substrate so as to cover at least the light emitting elements.

10. A light source according to claim 8, wherein the protective resin layer is a milky-white color.

11. A light source structured by a plurality of light-emitting elements being connected to predetermined positions of a wiring pattern formed in advance on a substrate, said light source comprising:

a reflecting member provided at a position of the substrate other than positions at which the plurality of light-emitting elements are disposed on the substrate, said reflecting member having a reflectance which is higher than a reflectance of the substrate, wherein the substrate is divided into plural divisional regions, and on/off control of the light emitting elements disposed in the divisional regions can be carried out per divisional region.

12. A light source structured by a plurality of light-emitting elements being connected to predetermined positions of a wiring pattern formed in advance on a substrate, said light source comprising:

a reflecting member provided at a position of the substrate other than positions at which the plurality of light-emitting elements are disposed on the substrate, said reflecting member having a reflectance which is higher than a reflectance of the substrate, wherein the substrate is structured by combining a plurality of secondary substrates, and on/off control of the light emitting elements disposed on the secondary substrates can be carried out per secondary substrate.

13. An original reading device according to claim 1, wherein the plurality of light-emitting elements are different types of light emitting elements which output lights of respectively different wavelength bands, and on/off control of the light emitting elements of the different types can be carried out per type.

14. A light source structured by a plurality of light-emitting elements being connected to predetermined positions of a wiring pattern formed in advance on a substrate, said light source comprising:

a reflecting member provided at a position of the substrate other than positions at which the plurality of light-emitting elements are disposed on the substrate, said reflecting member having a reflectance which is higher than a reflectance of the substrate, wherein the light emitting elements are formed from plural circuits which are each formed from plural light emitting elements connected in series, the plural circuits are disposed in parallel on the basis of a predetermined pattern, and on/off control of the light emitting elements of the circuits can be carried out per circuit.

15. A device according to claim 11, wherein each of the plural divisional regions includes different types of light-emitting elements which output lights of respectively different wavelength bands, and, in each of the plural divisional regions, on/off control of the light emitting elements can be carried out per type.

16. A device according to claim 12, wherein each of the plurality of secondary substrates includes different types of light emitting elements which output lights of respectively different wavelength bands, and, in each of the plurality of secondary substrates, on/off control of the light emitting elements can be carried out per secondary substrate.

* * * * *